United States Patent [19]
Takeuchi

[11] Patent Number: 5,720,424
[45] Date of Patent: Feb. 24, 1998

[54] WIRE BONDING APPARATUS

[75] Inventor: Takashi Takeuchi, Higashiyamato, Japan

[73] Assignee: Kabushiki Kaisha Shinkawa, Tokyo, Japan

[21] Appl. No.: 657,016

[22] Filed: May 30, 1996

[30]  Foreign Application Priority Data

May 30, 1995 [JP] Japan .................................. 7-154048

[51] Int. Cl.$^6$ .................................................. H01L 21/603
[52] U.S. Cl. ................................ 228/4.5; 228/59; 228/105
[58] Field of Search ................................ 228/1.1, 4.5, 8, 228/59, 105, 222; 219/56.21

[56]  References Cited

U.S. PATENT DOCUMENTS

| | | | |
|---|---|---|---|
| 5,211,325 | 5/1993 | Schweizer et al. | 228/105 |
| 5,501,388 | 3/1996 | Takeuchi | 228/1.1 |

FOREIGN PATENT DOCUMENTS

| | | | |
|---|---|---|---|
| 51-88177 | 7/1951 | Japan . | |
| 53-10268 | 1/1978 | Japan | H01L 21/60 |

*Primary Examiner*—Samuel M. Heinrich
*Attorney, Agent, or Firm*—Koda and Androlia

[57]  ABSTRACT

In a wire bonding apparatus used in manufacturing, for instance, semiconductor devices, a cover is attached to a detection image intake section of the camera mirror tube of a camera which detects the bonding points of a semiconductor workpiece, and the cover covers an area where a variation in air density occurs between the detection image intake section of the camera mirror tube and the semiconductor workpiece.

4 Claims, 1 Drawing Sheet

WIRE BONDING APPARATUS

BACKGROUND OF THE INVENTION

1. Field of the Invention

The present invention relates to a wire bonding apparatus and more particularly to a bonding point detection device used in a wire bonding apparatus.

2. Prior Art

In conventional wire bonding, when a semiconductor workpiece in which pellets are bonded to a lead frame is conveyed and positioned on a heating block and the bonding points of the semiconductor workpiece are detected by a camera, heat shimmer is generated by the heat from the heating block. This heat shimmer prevents the bonding points from being accurately detected. Accordingly, air or an inert gas is blown onto the bonding points so as to avoid the heat and accurately detect the bonding point. This is disclosed in, for example, Japanese Patent Application Laid-Open (Kokai) No. 53-10268 and Japanese Utility Model Application Laid-Open (Kokai) No. 51-88177. In these prior art, heat shimmer problems are solved by blowing away the heated air, thus preventing the heated air from entering into the area between the semiconductor workpiece and the camera mirror tube of a camera.

In the prior art described above, since air is blown onto the bonding surface, the bondability (or bonding quality) tends to drop, and the bonding wires suffer from stress. In addition, when a ball is formed at the end of a bonding wire, which extends from the lower end of the capillary, by an electric discharge from an electric torch, the air causes a deleterious effect on the electric discharge. Accordingly, it is necessary to inactivate the air blowing during the electric discharge.

SUMMARY OF THE INVENTION

In view of the above, the object of the present invention is to provide a wire bonding apparatus which causes no drop in bondability and has no deleterious effect on bonding wires.

The object of the present invention is accomplished by a unique structure for a wire bonding apparatus in which a camera mirror tube of a camera is moved over bonding points of a semiconductor workpiece positioned on a heating block so that the bonding points are detected by the camera and then the bonding wires are connected to the detected bonding points, and the unique structure of the present invention is that a cover is attached to the detection image intake section of the camera mirror tube in a manner that the cover extends downward to a point where a variation in air density occurs between the detection image intake section of the camera mirror tube and the semiconductor workpiece.

With the structure of the present invention as described above, when the camera mirror tube is moved over the bonding points of the semiconductor workpiece so that the bonding points are detected by the camera, the air heated by the heating block reaches the cover and the area inside the cover is heated. As a result, the heated air inside the cover does not come into direct contact with the surrounding cold air; and as a result, heat shimmer does not occur in the area between the semiconductor workpiece and the detection port of the detection image intake section.

DETAILED DESCRIPTION OF THE PREFERRED EMBODIMENTS

Figure 1:
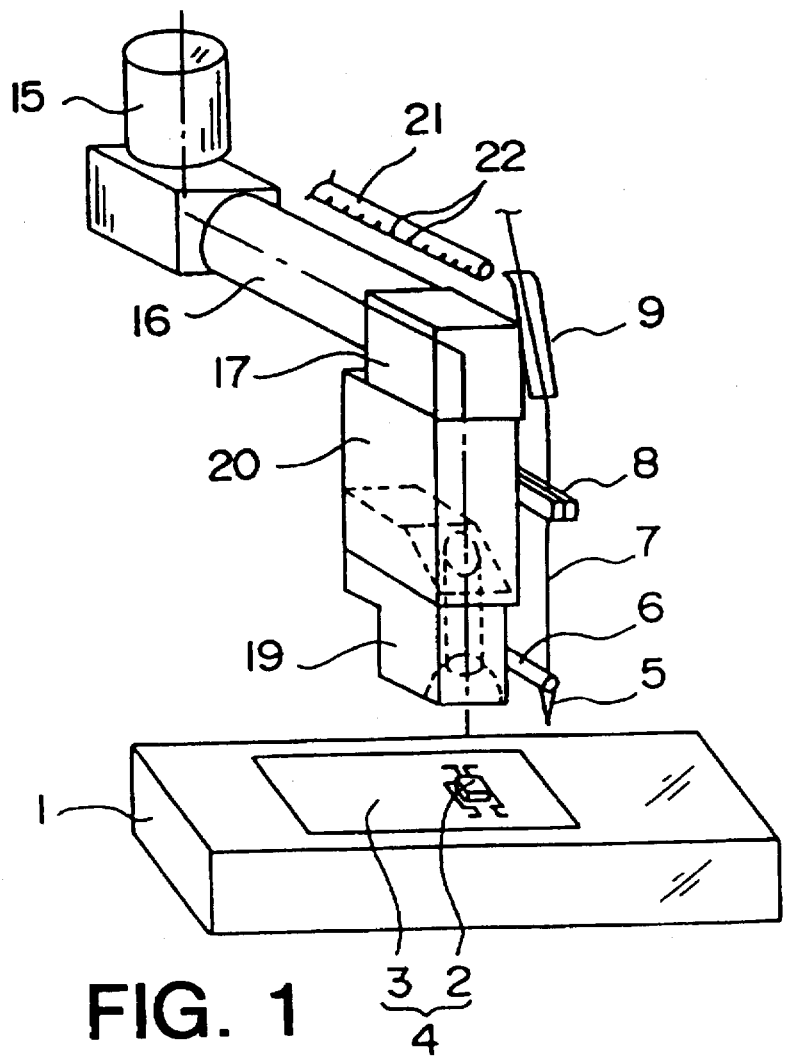
FIG. 1 is a perspective view which illustrates the essential parts of one embodiment of the wire bonding apparatus according to the present invention.

One embodiment of the present invention will be described below with reference to FIG. 1.

In the bonding apparatus to which the present invention is applied, a semiconductor workpiece 4 comprising a lead frame 3 to which a pellet 2 is bonded is positioned on a heating block 1. A bonding arm 6 which has a capillary 5 fastened to one end of the arm 6 is installed in a vertically movable fashion on a bonding head (not shown) which is driven in the X and Y directions (or in any horizontal direction). The reference numeral 7 is a bonding wire which passes through the capillary 5, 8 is a wire clamper, and 9 is a tension plate spring. The wire clamper 8 and tension plate spring 9 are installed on the bonding head (not shown) of the bonding apparatus.

A camera mirror tube 16 to which a camera 15 is attached is mounted on the bonding head. The detection port of the detection image intake section 17 of the camera mirror tube 16 is set so as to face down (in FIG. 1). In addition, an illumination assembly 19 which includes a plurality of LED's arranged in the form of a ring (not shown) is mounted on the bonding head (a means to mount the illumination assembly is not shown) so that the illumination assembly 19 is positioned beneath the detection port of the detection image intake section 17 of the camera mirror tube 16. The construction described so far is known in prior art; accordingly, a further description is omitted.

In the preferred embodiment of the present invention, a cover 20 is provided between the detection image intake section 17 of the camera mirror tube 16 and the illumination assembly 19 so that the cover 20 covers or encases the area between the detection image intake section 17 and the illumination assembly 19. In other words, the cover 20 is provided so as to encase an area which is approximately 10 mm above the heating block 1. In this embodiment, the cover 20 is formed as a substantially square tube as seen from FIG. 1 and is made of aluminum. The cover 20 is preferably made of materials having a heat-resisting property; and it can be metal (aluminum, stainless steel), vinyl chloride resin or epoxy resin.

The operation of the above embodiment will be described below.

Heat shimmer usually occurs in places where the air density varies. In other words, heat shimmer occurs as a result of air heated by the heating block 1 which rises and contacts the surrounding air. Tests have shown that if the temperature of the heating block is approximately 300° C. and the ambient temperature is 20° C., then heat shimmer occurs at a point approximately 10 mm above the heating block 1. Conventionally, as described in the prior art section in this specification, heat shimmer is prevented by blowing air into the heated air above the bonding surface of the semiconductor workpiece 14, thus blowing the heated air away so that no heated air is present in the area between the semiconductor workpiece 4 and the camera mirror tube 16.

In the preferred embodiment of the present invention, when the camera mirror tube 16 is caused to move over the bonding points of the semiconductor workpiece 14 so that the camera 15 detects the bonding points of the semiconductor workpiece 14, the air heated by the heating block 1 passes through the central empty space of the circularly arranged LEDs in the illumination assembly 19 and reaches the interior of the cover 20, so that the area inside the cover 20 is heated. Thus, the heated air inside the cover 20 is prevented from coming into direct contact with the surrounding cold air, and no temperature changes occur; therefore, heat shimmer does not occur in the area between the semiconductor workpiece 4 and the detection port of the detection image intake section 17.

Since heat shimmer is thus prevented without blowing air onto the semiconductor workpiece 4, there is no drop in bondability; and in addition, there is no deleterious effect on the bonding wires when wire bonding is completed. Furthermore, there is no need for providing a means to switch the air on and off.

Figure 2:
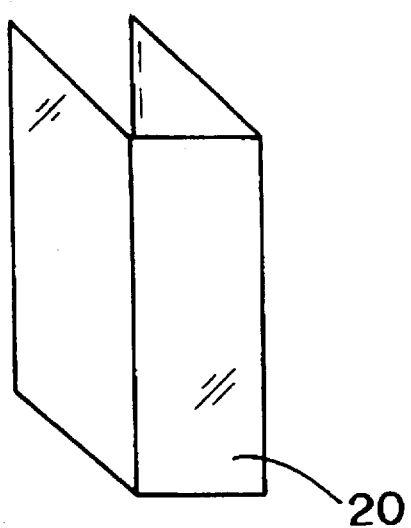
FIG. 2 is a perspective view of the cover in a different shape used in the present invention.

In the embodiment described above, the cover 20 is formed as a substantially square tube which covers the area between the detection image intake section 17 of the camera mirror tube 16 and the illumination assembly 19. However, the cover 20 can be formed so that it has an angled C-shaped cross section with the rear side, which faces the camera 15, opened as shown in FIG. 2. In this case, the heated air inside the cover 20 would contact cold air only after flowing to the rear side of the cover 20 since there is, structure-wise, substantially no space between the rear side of the cover 20 and the boding apparatus (not shown). In other words, the heated air inside the cover 20 would not come into direct contact with cold air; therefore, as in the embodiment described above, heat shimmer is prevented in the area between the semiconductor workpiece 4 and the detection image intake section 17.

In addition, the cover 20 can be installed in a dismountable fashion so as to allow an access to the area surrounded by the cover 20.

Furthermore, in the embodiment described above, the wire bonding apparatus includes the illumination assembly 19 which has a ring-form illumination under the camera mirror tube 16. However, when such an illumination assembly 19 is not used, then it is necessary to install the cover 20 at least in areas where heat shimmer would occur.

In the above embodiment, the camera mirror tube 16 is caused to undergo thermal expansion by the heated air inside the cover 20. When the camera mirror tube 16 undergoes thermal expansion, the bonding point detection point shifts, and a positional shift relative to the capillary 5 would occur. In order to prevent this, a cooling pipe 21 is fastened to the bonding head so as to extend along the camera mirror tube 16. The cooling pipe 21 has numerous air blowing holes 21 so that air is blown out toward the camera mirror tube 16. Since the cooling air is blown out of the pipe 21 onto the camera mirror tube 16, the generation of heat in the camera mirror tube 16 is prevented; and as a result, there is little thermal expansion in the camera mirror tube 16, and shifting of the position of the bonding point detection point can be prevented.

As seen from the above, the present invention is typically utilized in a wire bonding apparatus in which a camera mirror tube moves over the bonding points of a semiconductor workpiece placed on a heating block so that the bonding points are detected by a camera and then wires are connected to the detected bonding points, and the feature of the invention is that a cover which extends downward to a point where a variation in air density occurs between the detection image intake section of the camera mirror tube and the semiconductor workpiece is attached to the detection image intake section of the camera mirror tube of the camera used in the bonding apparatus. Accordingly, there is no drop in bondability, and there is no deleterious effect on the wires after the bonding is completed.

I claim:

1. A wire bonding apparatus in which a camera mirror tube is moved over bonding points of a workpiece positioned on a heating block of said bonding apparatus so that said bonding points are detected by a camera and then wires are connected to said detected bonding points, characterized in that a cover which extends to a point where a variation in air density occurs between a detection image intake section of said camera mirror tube and said semiconductor workpiece is attached to said detection image intake section.

2. A wire bonding apparatus according to claim 1, characterized in that said wire bonding apparatus is equipped with an illumination assembly which includes illumination means arranged in the form of a ring adjacent to said detection image intake section, and said cover is installed so that said cover covers an area defined between said detection image intake section and said illumination assembly.

3. A wire bonding apparatus according to claim 1, characterized in that a cooling air supply means which blows out cooling air is provided along said camera mirror tube.

4. A wire bonding apparatus used in manufacturing semiconductor devices in which a semiconductor device is heated by a heating block, comprising a cover attached to a detection image intake section of a mirror tube of a camera which is mounted to a bonding head of said bonding apparatus so as to detect bonding points of said semiconductor devices, said cover encasing an area which is defined by said detection image intake section of said camera and said heating block and in which air density changes due to air heated by said heating block.

* * * * *